United States Patent
Sundstrom et al.

(10) Patent No.: US 8,223,497 B2
(45) Date of Patent: Jul. 17, 2012

(54) THERMAL BRIDGE EXTENSIONS FOR A MODULE-CHASSIS INTERFACE

(75) Inventors: Lance LeRoy Sundstrom, Pinellas Park, FL (US); Michael Gillespie, Seminole, FL (US); Randolph Hook, Lutz, FL (US)

(73) Assignee: Honeywell International Inc., Morristown, NJ (US)

( * ) Notice: Subject to any disclaimer, the term of this patent is extended or adjusted under 35 U.S.C. 154(b) by 146 days.

(21) Appl. No.: 12/557,277

(22) Filed: Sep. 10, 2009

(65) Prior Publication Data

US 2011/0058336 A1    Mar. 10, 2011

(51) Int. Cl.
*H05K 7/20*    (2006.01)

(52) U.S. Cl. ........ 361/707; 361/704; 361/710; 361/715; 361/720; 165/80.3; 165/185; 174/252

(58) Field of Classification Search ............... 361/704, 361/707, 709, 710, 715, 717, 719–722, 726, 361/732, 759
See application file for complete search history.

(56) References Cited

U.S. PATENT DOCUMENTS

| | | | |
|---|---|---|---|
| 4,721,155 A | | 1/1988 | McNulty |
| 5,109,318 A | | 4/1992 | Funari et al. |
| 5,184,281 A | | 2/1993 | Samarov et al. |
| 5,224,016 A | | 6/1993 | Weisman et al. |
| 5,407,297 A | | 4/1995 | Hulme et al. |
| 5,472,353 A | | 12/1995 | Hristake et al. |
| 5,677,514 A | * | 10/1997 | Schwamm et al. ............ 174/252 |
| 5,892,660 A | | 4/1999 | Farnworth et al. |
| 6,687,130 B2 | | 2/2004 | Adams, Sr. et al. |
| 6,765,797 B2 | | 7/2004 | Summers et al. |
| 6,765,798 B1 | * | 7/2004 | Ratliff et al. .................. 361/704 |
| 6,771,504 B2 | * | 8/2004 | Barcley ........................ 361/704 |
| 6,873,528 B2 | * | 3/2005 | Hulan et al. .................. 361/719 |
| 7,031,167 B1 | * | 4/2006 | Zagoory et al. ............... 361/759 |
| 7,079,396 B2 | | 7/2006 | Gates et al. |
| 7,322,843 B1 | | 1/2008 | Lee et al. |
| 7,345,882 B2 | | 3/2008 | Lee et al. |
| 7,349,221 B2 | | 3/2008 | Yurko |
| 2003/0223197 A1 | | 12/2003 | Hulan et al. |
| 2008/0019102 A1 | * | 1/2008 | Yurko .......................... 361/719 |
| 2009/0135565 A1 | * | 5/2009 | Legen et al. .................. 361/715 |
| 2010/0039770 A1 | | 2/2010 | Danello et al. |

FOREIGN PATENT DOCUMENTS

| | | |
|---|---|---|
| DE | 88 11 949 | 9/1988 |
| EP | 2 061 296 A1 | 5/2009 |

OTHER PUBLICATIONS

European Search Report from corresponding EP Application No. 10173478.8, mailed Jun. 16, 2011, 7 pages.
Reply to communication from the Examining Division, for EP Application No. 10173478.8, dated Dec. 21, 2011, 12 pages.

\* cited by examiner

*Primary Examiner* — Courtney Smith
(74) *Attorney, Agent, or Firm* — Shumaker & Sieffert, P.A.

(57) ABSTRACT

A module for use with an expandable wedge clamp assembly in a chassis channel is provided. The module comprises a first side, a second side, a first extension attached to the first side, and a second extension attached to the second side. The first extension and the second extension are flexible. When the wedge clamp assembly is expanded, the first extension and the second extension flex from a first position to a second position. When the wedge clamp is returned from the expanded position to a relaxed position, the first extension and the second extension return from the second position to the first position.

20 Claims, 6 Drawing Sheets

THERMAL BRIDGE EXTENSIONS FOR A MODULE-CHASSIS INTERFACE

FIELD

The present invention relates generally to an apparatus for mounting and fastening a printed board assembly (PBA) module to one or more channels of a rack or chassis. More particularly, the present invention relates to a thermal bridge PBA module with thermal bridge extensions that can be expanded transversely for mounting, fastening and heat sinking a PBA module to one or more channels of a rack or chassis.

BACKGROUND

Elongated wedge clamp assemblies are currently used for fastening a printed board assembly (PBA) or a PBA module to a channel of a rack or chassis. The wedge clamp assembly typically includes a plurality of wedges, each wedge having one or two ends with sloped surfaces. The sloped surfaces of each wedge abut against the sloped surface of the adjacent wedge. A screw extends length-wise through each wedge and connects together the plurality of wedges. The end wedge remote from the head of the screw typically has a threaded bore engaged by the screw such that a clockwise rotation of the screw draws the wedges toward each other, causing the wedges to deflect transversely from each other on the sloped abutting surfaces. This axial to transverse motion increases the assembly's width as its length is compressed, and thereby presses one side of the PBA or PBA module against the chassis channel wall, fastening the PBA or PBA module tightly within the chassis channel. Subsequently rotating the screw in a counterclockwise direction moves the wedges apart from each other, to bring them back into longitudinal alignment with each other and, thereby, to release the clamping force on the PBA or PBA module.

The expansion pressure of the wedge clamp is intended to mechanically lock the PBA or PBA module in position via static friction and to provide a low thermal resistance between the PBA or PBA module side and chassis channel wall that are in direct contact, as later described and shown in FIG. 1. The thermal resistance across a thermal interface is a function of the interfacing materials, the surface roughness, the contact area, and the contact pressure. The thermal resistance from the other PBA or PBA module side through the expanded wedge clamp and to the other chassis channel wall is much higher. This is due to the relatively small contact areas at the abutted hollow sloped wedge interfaces. These small contact areas create points of high thermal resistance, often referred to as thermal bottlenecks.

Some thermal bridge PBA modules are used, wherein thermal bridge structures are located on either side of the PBA such that the PBA is sandwiched between them, later described and shown in FIG. 2. Each thermal bridge structure has an external skin that is displaced from the printed board (PB) surface as needed to provide component clearance. Rib or post extensions from the thermal bridge external skin to the PB surface, typically at the PB periphery and periodically in between, provide PB mechanical support and PB heat sinking. Extensions from the thermal bridge external skin to the top of components provide component heat sinking. At the chassis channel interface, the thermal bridge external skin is not displaced from the PB surface and is in direct contact with the PB surface on either side to keep this interface narrow. A wedge clamp is mounted on one side of this interface to provide pressure to mechanically lock the thermal bridge PBA module in position. In this configuration, one thermal bridge is in direct contact with a chassis channel wall on one side and with one PB side on the other. The other thermal bridge is in direct contact with the other PB side on one side and with one wedge clamp side on the other side. The other wedge clamp side is in direct contact with the other chassis channel wall. In this configuration, because only one thermal bridge is in direct contact with a chassis channel wall, the thermal bridge on one side typically has a much lower thermal resistance to the chassis than the thermal bridge on the opposite side. Components on one side of the PBA module will therefore have a much higher thermal resistance to the chassis than components on the other side.

SUMMARY

In accordance with the present invention, a PBA module for use with an expansion clamp in each of one or more chassis channels is provided. The structure of the PBA module allows for flexion of some of the PBA module parts, allowing for better mechanical fit and thermal conduction between the PBA module and the one or more chassis channels.

In the preferred embodiment, a PBA module for use with a single expansion clamp in a single chassis channel at each chassis interface is provided. The PBA module comprises a printed board assembly sandwiched between a first thermal bridge stiffener with a first side portion and a first extension, and a second thermal bridge stiffener with a second side portion and a second extension. The first extension comprises a first external wall and a first internal wall, and the second extension comprises a second external wall and a second internal wall. The first extension is integral or attached to the first side portion of the first thermal bridge stiffener. The second extension is integral or attached to the second side portion of the second thermal bridge stiffener. The expansion clamp is fastened to the internal wall of the first or second thermal bridge stiffener extension. The first internal wall and the second internal wall each have at rest a first position, and in response to pressure applied to the first internal wall and the second internal wall, the first and second internal walls move laterally to a second position. The distance between the first internal wall and the second internal wall is greater at the second position than at the first position.

In another embodiment, a PBA module for use with an expansion clamp in each of two chassis channels shared with those of adjacent PBA modules at each module-chassis interface is provided. The PBA module comprises a printed board assembly (PBA) sandwiched between a thermal bridge stiffener pair. The thermal bridge stiffener pair comprises a first structure with a first extension, and a second structure with a second extension. The first extension comprises a first external wall and a first internal wall. The second extension comprises a second external wall and a second internal wall. The expansion clamp is affixed to the external wall of the first or second extension. The first extension is integral or attached to the first structure, and the second extension is integral or attached to the second structure. A space is defined between the external walls of adjacent PBA modules sharing a common chassis channel. The external walls of the adjacent PBA modules each have a first position, and in response to pressure applied to the external walls, each external wall moves laterally to a second position. At the second position the defined space between the external walls is greater than at the first position.

BRIEF DESCRIPTION OF THE DRAWINGS

Various embodiments are described herein with reference to the following drawings. Certain aspects of the drawings are depicted in a simplified way for reason of clarity. Not all alternatives and options are shown in the drawings and, therefore, the invention is not limited in scope to the content of the drawings. In the drawings.

DETAILED DESCRIPTION

Figure 1:
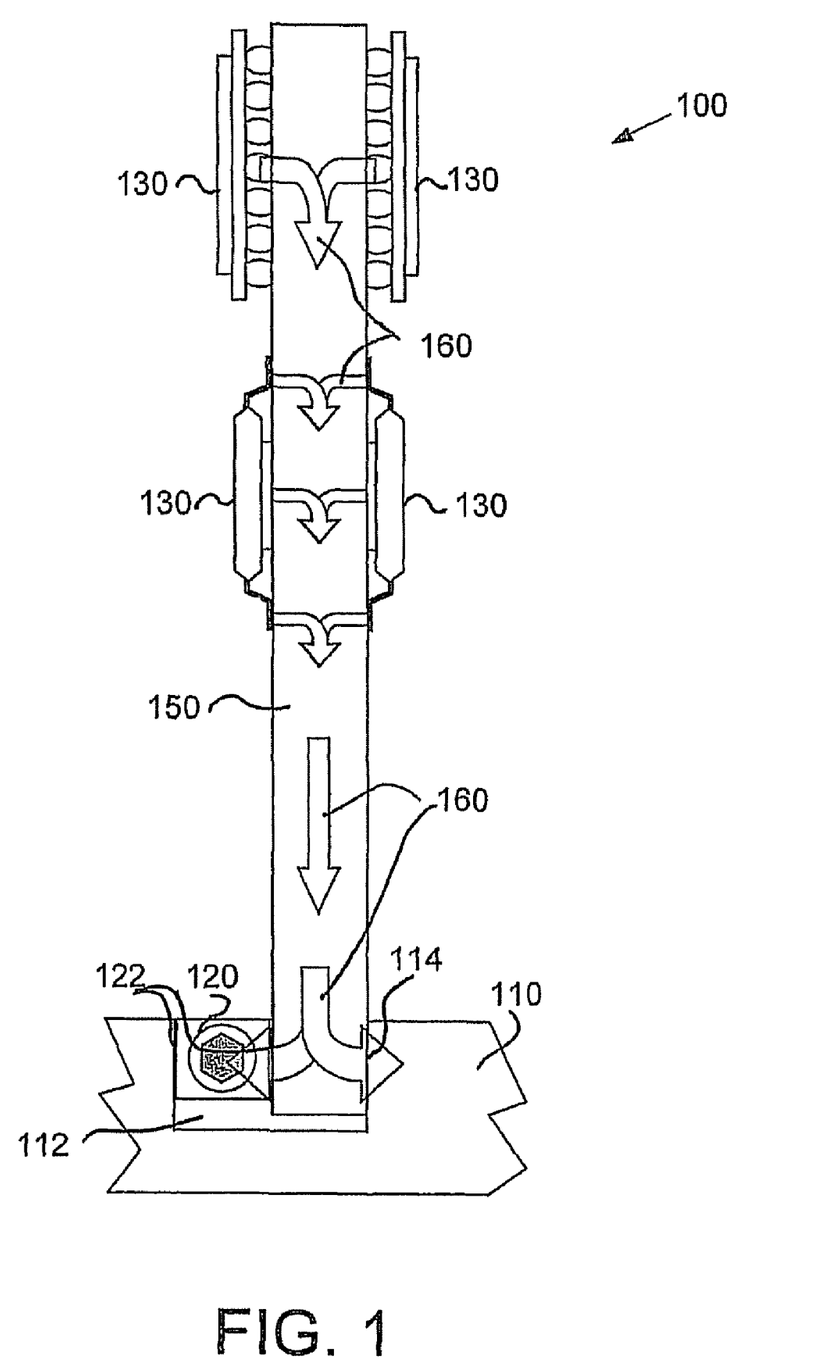
FIG. 1 depicts a bottom cross section view of a conventional configuration for a printed board assembly retained within a chassis channel with a locking wedge clamp.

FIG. 1 depicts a bottom cross section view of a prior art configuration for a printed board assembly (PBA) 100 retained within a chassis channel with a locking wedge clamp assembly. The PBA 100 is retained in an elongated chassis channel 112 formed in a chassis 110 by means of a locking wedge clamp assembly 120. Locking wedge clamp assembly 120 comprises wedge clamp interfaces 122. When relaxed (in the elongation aligned position), locking wedge clamp assembly 120 provides enough clearance for PBA insertion and removal. Once the (PBA) connector is fully mated to its master interconnect board (MIB) connector, the wedge clamps of locking wedge clamp assembly 120 are tightened to lock PBA 100 in position. One side of one edge of PBA 100 then abuts one wall of chassis channel 112 at an interface 114.

In the case of this prior art configuration, thermal conduction takes place from electrical components 130 to the interface 114 through the printed board (PB) surface and buried conductor layers 150. The path of thermal conduction is shown with arrows 160. Thermal conduction from the body of one of the electrical components 130, such as the upper ball grid array (BGA) device shown in FIG. 1, to the PB surface and buried conductor layers 150 is through its interfacial BGA connections. However, other electrical components 130, such as the lower quad flat pack device shown in FIG. 1, may transmit thermal conduction through interfacial thermal interface material (TIM). Thermal conduction then takes place through the PB surface and buried conductor layers 150, and next through the wedge clamp interfaces 122 on one side and the direct chassis interface 114 on the other side. Most of the thermal conduction to the chassis takes place at interface 114 due to the direct contact between the PB and the chassis. Thermal conduction from the PB through locking wedge clamp assembly 120 to the chassis is much less because of the poor thermal conduction through the wedge clamp assembly.

Because the PBA of FIG. 1 is clamped against one chassis channel wall, any horizontal misalignment, due to fabrication and assembly tolerance buildup, translates into module-MIB connector alignment and mating issues or built in stress and strain along the horizontal axis at the mated module-MIB connector interface after the PBA is locked in position. The chassis channel must be wide enough to provide clearance for the widest PBA chassis interface to facilitate ease of PBA insertion and extraction from the chassis. For best module-MIB connector alignment and mating conditions, nominal dimensioning positions the PBA chassis interface in the center of the chassis for a mated condition. This allows room for the PBA to shift in any direction, or float, as the connectors are mated. However, when the PBA is pushed against one chassis channel wall, this puts stress/strain on the module-MIB connector interface. For the best mated and clamped conditions, nominal dimensioning positions the PBA chassis interface against one chassis wall for the mated condition. However, this leaves no room for the PBA to float as the connectors are mated.

Figure 2:
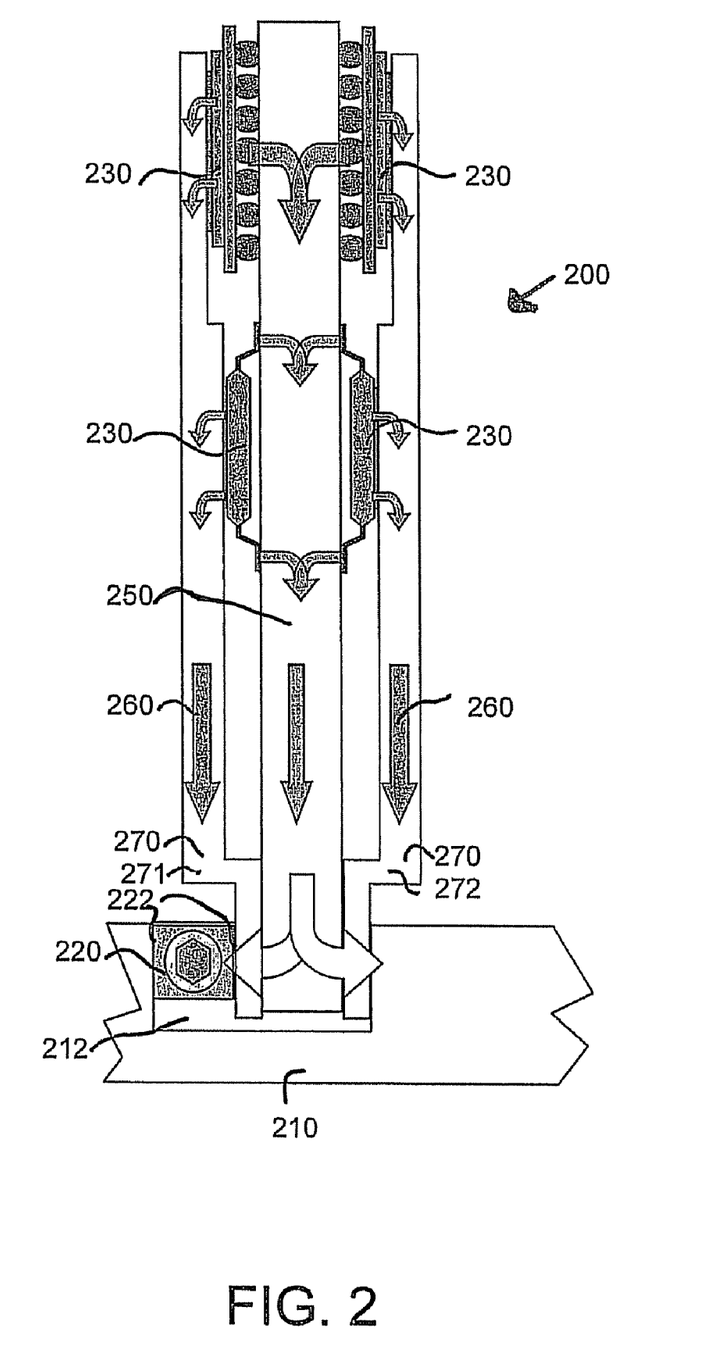
FIG. 2 depicts a bottom cross section view of a prior art configuration for a printed board assembly module with thermal bridges that is retained within a chassis channel with a wedge clamp assembly.

FIG. 2 depicts a bottom cross section view of another prior art configuration for a thermal bridge printed board assembly (PBA) module 200 retained within a chassis channel with a locking wedge clamp assembly. Thermal bridge PBA module 200 is retained in an elongated channel 212 formed in a chassis 210 by means of a locking wedge clamp assembly 220. Locking wedge clamp assembly 220 comprises wedge clamp interfaces 222. Thermal conduction from the components 230 follows the paths shown with the plurality of arrows 260, through a printed board (PB) 250 and the thermal bridge stiffeners 270 on both sides. The right thermal bridge stiffener 272 has direct contact between its left side and the right PB side and between its right side and the right chassis channel wall of chassis 210. The left thermal bridge stiffener 271 has direct contact between its right side and the left PB side and between its left side and the right wedge clamp interface 222. The left wedge clamp interface 222 is in direct contact with the left chassis channel wall of chassis 210. Components on the left side of this thermal bridge PBA module will have a higher thermal resistance to the chassis than components on the right side. Again, because the thermal bridge PBA module of FIG. 2 is clamped against one chassis channel wall, any horizontal misalignment, due to fabrication and assembly tolerance buildup, translates into module-MIB connector alignment and mating issues or built in stress and strain along the horizontal axis at the mated module-MIB connector interface after the thermal bridge PBA module is locked in position.

Figure 3A:
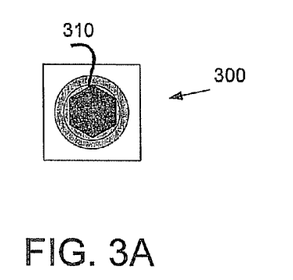
FIG. 3a depicts a screw end view of an exemplary locking wedge clamp assembly in the relaxed position.
Figure 3B:
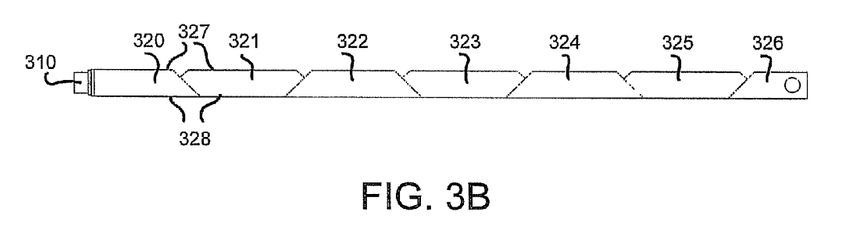
FIG. 3b depicts a side view of the exemplary locking wedge clamp assembly of FIG. 3a in the relaxed position.
Figure 3C:
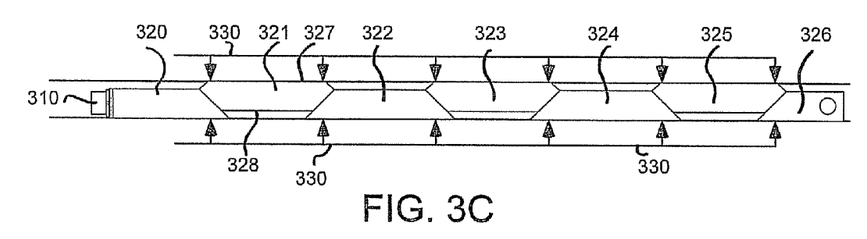
FIG. 3c depicts a side view of the exemplary locking wedge clamp assembly of FIGS. 3a and 3b in the expanded position.

FIGS. 3a-3c illustrate an exemplary locking wedge clamp assembly 300 of the present invention. FIGS. 3a and 3b show screw end and side views, respectively, of locking wedge clamp assembly 300 in the relaxed position (elongation aligned). Locking wedge clamp assembly 300 comprises a plurality of wedges, including a first wedge 320, a second wedge 321, a third wedge 322, a fourth wedge 323, a fifth wedge 324, a sixth wedge 325, and a seventh wedge 326. Locking wedge clamp assembly 300 also comprises an axial tension screw 310. Screw 310 extends length-wise through each of the plurality of wedges, connecting the plurality of wedges together. In the relaxed position, the wedges are aligned with each other, such that a first side 327 is flush with the first sides 327 of the other wedges, and a second side 328 of each wedge is flush with the second sides 328 of the other wedges.

FIG. 3c shows a side view of the locking wedge clamp assembly of FIGS. 3a and 3b in the expanded position (elongation compressed). To get from the relaxed position in FIGS. 3a and 3b to the expanded position in FIG. 3c, axial tension screw 310 is rotated, causing of the plurality of wedges 320 to move transversely relative to each other. In the expanded position, first sides 327 of second wedge 321, fourth wedge 323, and sixth wedge 325 are now located on a plane above the first sides 327 of first wedge 320, third wedge 322, fifth wedge 324, and seventh wedge 326, as shown in FIG. 3c.

A plurality of arrows 330 in FIG. 3c show where thermal bottlenecks may occur when locking wedge assembly 300 is in the expanded position. Thermal bottlenecks occur because of the structure and movement of the wedges. Each wedge is hollow to provide clearance for the axial tension screw in both relaxed and expanded positions. When expanded, the bottom sides 328 of the first wedge 320, third wedge 322, fifth wedge 324 and seventh wedge 326 are against the PBA while the top sides 327 of the second wedge 321, fourth wedge 323 and sixth wedge 325 are against the chassis. The only thermal path through the expanded wedge clamp is through the small sloped abutted interfaces between adjacent wedges.

Figure 4A:
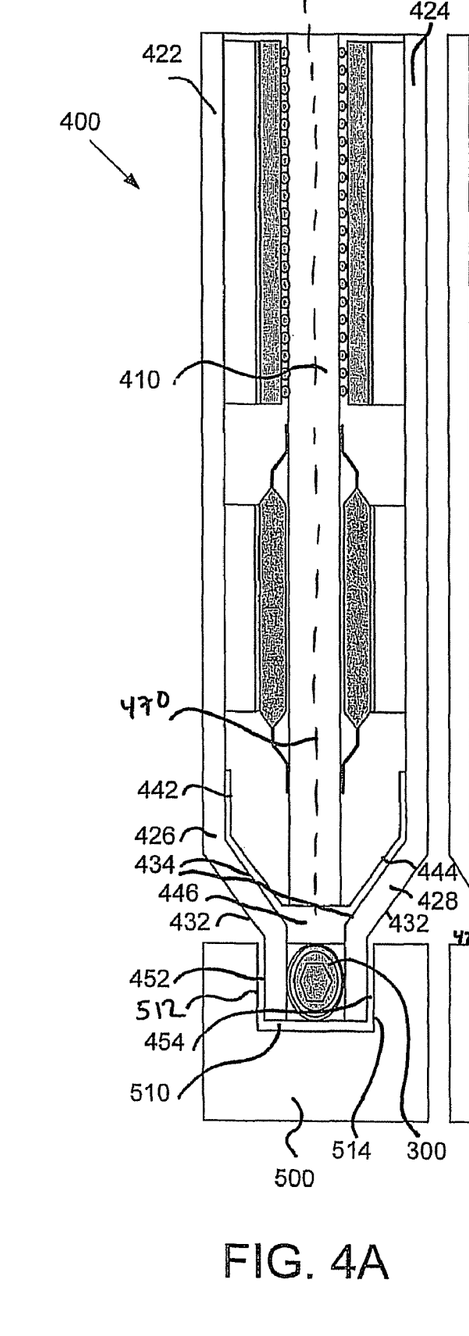
FIG. 4a depicts a bottom cross section view of a thermal bridge PBA module according to a preferred embodiment of the present invention with its thermal bridge stiffener extensions in the unclamped position.

FIG. 4a depicts a bottom cross section view of a thermal bridge printed board assembly (PBA) module 400 according to one embodiment of the present invention. Thermal bridge PBA module 400 comprises a first side portion 422, a second side portion 424, a first extension 426, and a second extension 428. First side portion 422 and second side portion 424 may also be referred to as a thermal bridge-stiffener pair with chassis interface extensions. First side portion 422 and second side portion 424 may be referred to as a first thermal bridge structure and a second thermal bridge structure. PBA 410 is attached within PBA module 400. PBA 410 may be sandwiched between first side portion 422 and second side portion 424 within PBA module 400. To affix PBA 410 to the side portions, the PBA may be bolted. First extension 426 may be manufactured to be integral with first side portion 422 and second extension 428 may be manufactured to be integral with second side portion 424. In the alternative, first extension 426 and second extension 428 may be separate parts, and may be affixed to first side portion 422 and second side portion 424.

Interfacial thermal interface material (TIM) is used between the top of each PBA component and side portion to reduce the component package to side portion thermal resistance. Ball grid array (BGA) and peripheral leaded component packages are shown in this example, but other device types may also be used. First side portion and second side portion may be custom milled to provide an extension from the side portion to each component to minimize the interfacial TIM thickness and thermal resistance at each component. Each side portion may be constructed from pure aluminum. In alternate embodiments, each side portion may be constructed from an aluminum beryllium composite, or a diamond filled aluminum matrix. Extensions 426, 428 are preferably made from a flexible thermally conductive material. As previously described, the extensions 426, 428 may be made as an integral part of the side portions and may thus comprise the same material as first side portion 422 and second side portion 424. In an alternate embodiment, one or both of extensions 426, 428 may be made separately and from a different material, such as copper, for example. In this embodiment, extensions 426, 428 may be bolted, bonded, or welded to first side portion 422 and second side portion 424.

Although the description and figures describe the invention to be used with a wedge clamp assembly, an alternate expansion clamp may be used in place of a conventional wedge clamp assembly.

Portions of first extension 426 and second extension 428 extend into a channel 510 in chassis 500. Channel 510 comprises a left channel wall 512 and a right channel wall 514. In this preferred embodiment, both first and second extensions 426 and 428 share a common expansion clamp assembly 300 bolted to one of the extensions 426 or 428 and a common chassis channel 510 at each module-chassis interface.

The chassis comprises a metal frame on which electronics modules, such as a Standard Electronics Module format E (SEM-E), are mounted. Electronic component package types that may be mounted on the PBA and thermally bonded to the thermal bridge stiffeners of such modules include multichip module (MCM), ball grid array (BGA), dual/quad flat packs, SMD-1, as well as other electronic devices or components.

Figure 4B:
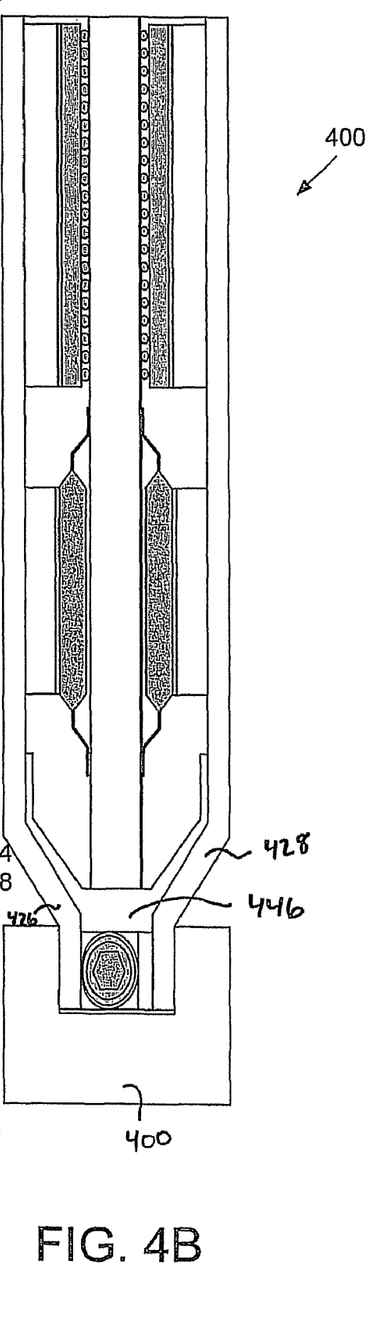
FIG. 4b depicts a bottom cross section view of the thermal bridge PBA module of FIG. 4a with its thermal bridge stiffener extensions in the clamped position.

First extension 426 comprises an external wall 432 and an internal wall 434. Second extension 428 also comprises an external wall 432 and an internal wall 434. Internal walls 434 of first extension 426 and second extension 428 may form a modified v-shape, as shown in FIG. 4a. To form this shape, at least a portion of first extension 426 is at an angle and at least a portion of second extension 428 is at an angle. The angle and length of the angled sections of the extensions are determined as needed so that the extensions extend into a common chassis channel, as shown in FIGS. 4a and 4b.

The first side portion 422 may comprise a first edge 442 and the second side portion 424 may comprise a second edge 444. A space 446 may be present between first edge 442 and internal wall 434 of first extension 426, and between second edge 444 and internal wall 434 of second extension 428. Space 446 provides for flexure of first extension 426 and second extension 428. The amount of flexure needed for first extension 426 and second extension 428 may be the difference between the unclamped clearance-fit configuration of FIG. 4a and the clamped press-fit configuration of FIG. 4b. This amounts to clearance 452 between the first external wall 432 of the first extension 426 and the left chassis channel wall 512 and clearance 454 between the second external wall 432 of second extension 428 and the right chassis channel wall 514, as depicted in FIG. 4a.

In operation, the expansion clamp assembly 300 is positioned between the portions of first extension 426 and second extension 428 that extend into chassis channel 510, as shown in FIG. 4a. The printed board assembly (PBA) is sandwiched between first side portion 422 and second side portion 424. The screw on the wedge clamp assembly is turned and the wedge pieces of the assembly translate to the expanded position shown in FIG. 3c. FIG. 4b shows the module of FIG. 4a when the wedge clamp assembly is in the expanded position. The module position remains the same whether in the unclamped clearance-fit or clamped press-fit configurations. As can be seen from FIG. 4b, first extension 426 is flexed, moving laterally toward the left channel wall 512, filling the left clearance-fit 452 at the module-chassis interface from FIG. 4a. External wall 432 of first extension 426 now abuts left channel wall 512. The second extension 428 extension is also flexed, having moved toward the right channel wall 514 and filling the right clearance-fit 454 at the module-chassis interface from FIG. 4a. Exterior surface 432 of second extension 428 now abuts right channel wall 514. The degree of movement or flexion of each extension is small enough that permanent deformation does not occur, and each extension will return to the configuration shown in FIG. 4a when the wedge clamp assembly is returned to the relaxed position of FIGS. 3a and 3b. The ability of the extensions to flex in this manner ensures good conformance between external wall 432 of first extension 426 and left chassis channel wall 512 and between external wall 432 of second extension 428 and right chassis channel wall, and minimal thermal resistance at the module-chassis interface.

Because of the structure of the flexible extensions, the module 400 is not displaced vertically or horizontally as it is locked into position, so that no built-in stress or strain are applied to the mated module-MIB connector interface.

Figure 5A:
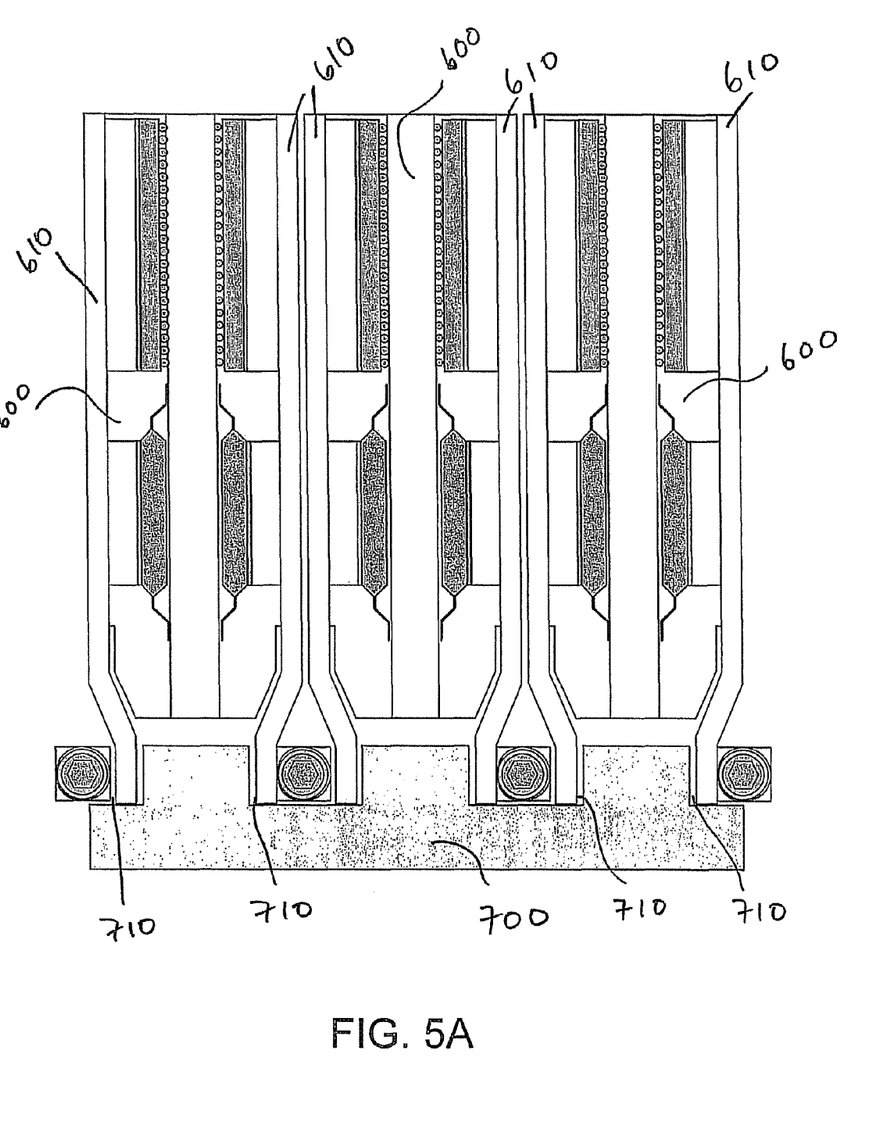
FIG. 5a depicts a bottom cross section view of a thermal bridge PBA module according to another embodiment of the present invention with its thermal bridge stiffener extensions in the unclamped position.

FIG. 5a depicts a bottom cross section view of a thermal bridge PBA module according to another embodiment of the present invention. In this embodiment, several thermal bridge PBA modules 600 are lined up in a row on a chassis 700. Chassis 700 may comprise a plurality of channels 710. Thermal bridge PBA modules 600 may each comprise a thermal bridge stiffener 610 with extension on either side of the PBA. In FIG. 5a, the extensions of thermal bridge stiffener extensions 610 are in the unclamped position.

Figure 5B:
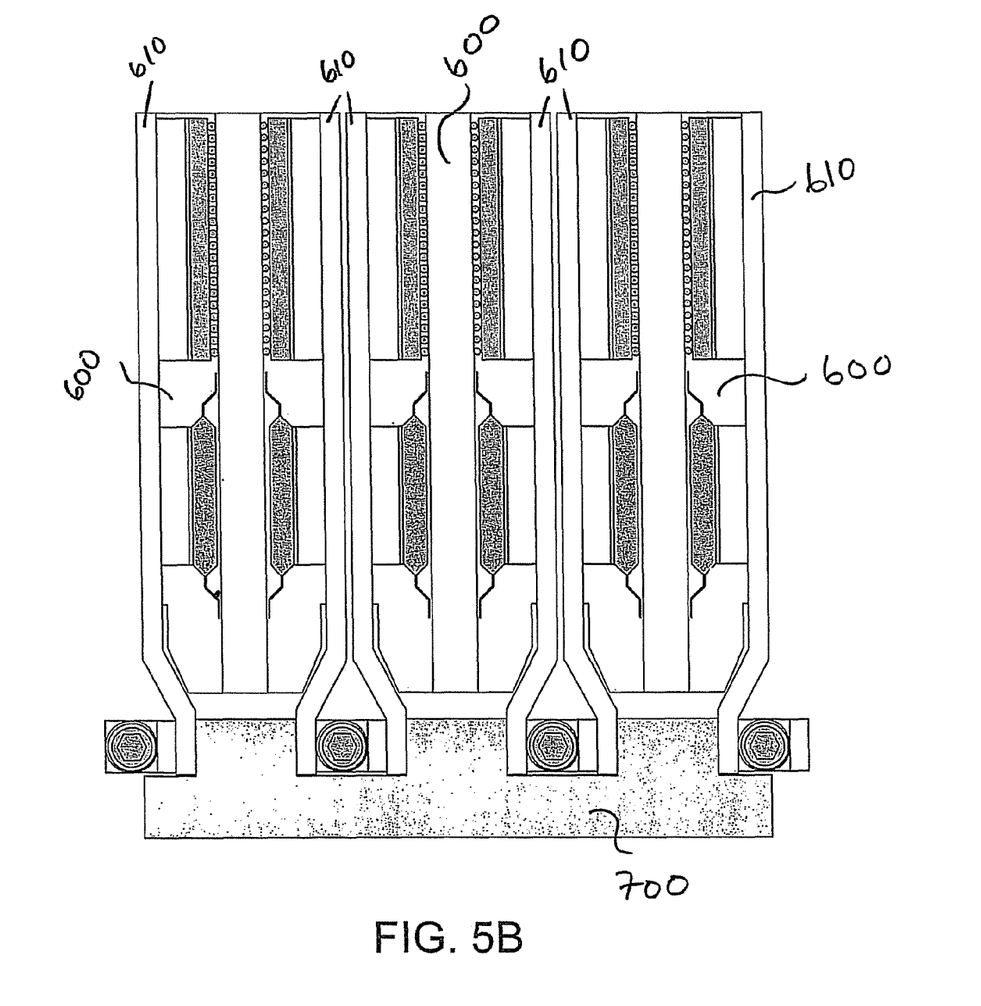
FIG. 5b depicts a bottom cross section view of the thermal bridge PBA module of FIG. 5a with its thermal bridge extensions in the clamped position.

FIG. 5b depicts a bottom cross section view of the thermal bridge PBA module 600 of FIG. 5a with the extensions of its thermal bridge stiffeners 610 in the clamped position. The thermal bridge extensions of each thermal bridge PBA module share a chassis channel and a wedge clamp assembly on each side with the adjacent thermal bridge PBA module. For this configuration, two wedge clamp assemblies at each module-chassis interface must be relaxed for module insertion or removal or expanded for module clamping. For the configuration of FIGS. 4a and 4b, a single wedge clamp assembly at each module-chassis interface must be relaxed for module insertion or removal or expanded for module clamping without affecting adjacent modules.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. A module for use with a wedge clamp and a chassis including at least one chassis channel, the module comprising:
    a first side portion;
    a second side portion;
    a printed board assembly between the first side portion and second side portion;
    a first extension, the first extension comprising a first external wall and a first internal wall; and
    a second extension, the second extension comprising a second external wall and a second internal wall,
    wherein the first extension is attached to the first side portion and the second extension is attached to the second side portion,
    wherein the first internal wall and the second internal wall each have a first position,
    wherein, in response to pressure applied to the first internal wall and the second internal wall, the first and second internal walls move to respective second positions, wherein, when the first and second internal walls are at the respective second positions, the distance between the first internal wall and the second internal wall is greater than when the first and second internal walls are at the respective first positions, and wherein, when the module is attached to the chassis, the first extension and the second extension are configured to at least partially extend into the at least one channel.

2. The module of claim 1, wherein each of the first extension and the second extension comprises a flexible material.

3. The module of claim 1, wherein the module comprise a thermal bridge printed board assembly module.

4. The module of claim 1, wherein at least a portion of each of the first internal wall and the second internal wall is configured to be adjacent to the wedge clamp when the module is attached to the chassis.

5. The module of claim 4, wherein expansion of the wedge clamp applies the pressure to the first internal wall and the second internal wall.

6. The module of claim 5, wherein in the respective second positions, the first external wall and the second external wall abut walls of the at least one chassis channel.

7. The module of claim 6, wherein in the respective second positions, both the first external wall and the second external wall are mechanically locked against walls of the at least one chassis channel via static friction.

8. The module of claim 7, wherein after the pressure is removed from the first internal wall and the second internal wall, the first extension and the second extension return to the respective first positions.

9. The module of claim 1, wherein a space is defined between the first internal wall and the second internal wall.

10. The module of claim 9, wherein the space is greater when the first extension and second extensions are at the respective second positions than at the respective first positions.

11. A thermal bridge stiffener pair for use with an expansion clamp in a chassis including at least one chassis channel, the thermal bridge stiffener pair comprising:
    a first structure;
    a second structure;
    a first extension, the first extension comprising a first external wall and a first internal wall; and
    a second extension, the second extension comprising a second external wall and a second internal wall,
    wherein the thermal bridge stiffener pair is configured to receive a printed board assembly therebetween,
    wherein the first extension is attached to the first structure and the second extension is attached to the second structure and wherein a space is defined between the second internal wall and the first internal wall,
    wherein the first internal wall and the second internal wall each have a first position,
    wherein in response to pressure applied to the first internal wall and the second internal wall, the first and second internal walls move to respective second positions, and wherein when the first and second internal walls are at the respective second positions, the distance between the first internal wall and second internal wall is greater than when the first and second internal walls are at the respective first positions, and wherein, to attach the printed board assembly to the chassis, the first extension and the second extension are configured to at least partially extend into the at least one channel.

12. The thermal bridge stiffener of claim 11, wherein, after the removal of the applied pressure, the first internal wall and the second internal wall move from the respective second positions to the respective first positions.

13. The thermal bridge stiffener of claim 11, wherein at least a portion of each of the first internal wall and the second internal wall is configured to be adjacent to the expansion clamp when the thermal bridge stiffener pair is attached to the chassis.

14. The thermal bridge stiffener of claim 13, wherein in the respective second positions, both the first external wall and the second external wall are mechanically locked against walls of the at least one chassis channel via static friction.

15. The thermal bridge stiffener of claim 11, wherein in the respective second positions, the first external wall and the second external wall abut walls of the at least one chassis channel.

16. The thermal bridge stiffener of claim 11, wherein the first extension and the second extension are angled.

17. A module-chassis interface comprising:
two flexible thermal bridge stiffener extensions, wherein each of the two flexible thermal bridge stiffener extensions comprises an external wall, and wherein the two flexible thermal bridge stiffener extensions comprise a first extension attached to a first side portion and a second extension attached to a second side portion;
a printed board assembly between the first side portion and second side portion; and
a chassis channel, wherein the chassis channel comprises a left channel wall and a right channel wall, wherein the left channel wall and the right channel wall substantially face each other,
wherein the external wall of one of the two flexible thermal bridge stiffener extensions flexibly extends so as to directly abut the left channel wall, and the external wall of the other of the two flexible thermal bridge stiffener extensions flexibly extends so as to directly abut the right channel wall.

18. The module-chassis interface of claim 17, wherein the two flexible thermal bridge stiffener extensions are from a common bridge printed board assembly module.

19. The module-chassis interface of claim 17, wherein the two flexible thermal bridge stiffener extensions are from adjacent bridge printed board assembly modules.

20. The module-chassis interface of claim 17, further comprising an expansion clamp between the two flexible thermal bridge stiffener extensions.

* * * * *